United States Patent
Anc et al.

(10) Patent No.: US 6,593,173 B1
(45) Date of Patent: Jul. 15, 2003

(54) LOW DEFECT DENSITY, THIN-LAYER, SOI SUBSTRATES

(75) Inventors: Maria J. Anc, Marlborough, MA (US); Robert P. Dolan, Hudson, NH (US)

(73) Assignee: Ibis Technology Corporation, Danvers, MA (US)

( * ) Notice: Subject to any disclaimer, the term of this patent is extended or adjusted under 35 U.S.C. 154(b) by 0 days.

(21) Appl. No.: 09/723,801

(22) Filed: Nov. 28, 2000

(51) Int. Cl.[7] .................. H01L 21/00; H01L 21/84; H01L 21/76

(52) U.S. Cl. .............. 438/149; 438/407; 438/423; 438/480; 438/766

(58) Field of Search .................. 638/149, 407, 638/423, 480, 766

(56) References Cited

U.S. PATENT DOCUMENTS

| | | | |
|---|---|---|---|
| 4,676,841 A | 6/1987 | Celler | 148/1.5 |
| 4,975,126 A | 12/1990 | Margail et al. | 145/33.2 |
| 5,616,507 A | 4/1997 | Nakai et al. | 438/480 |
| 5,661,044 A | 8/1997 | Holland et al. | 438/766 |
| 5,707,899 A | 1/1998 | Cerfolini et al. | 438/407 |
| 5,741,717 A | 4/1998 | Nakai et al. | 437/24 |
| 5,891,265 A | 4/1999 | Nakai et al. | 148/33.3 |
| 5,930,643 A | 7/1999 | Sadana et al. | 438/407 |
| 5,989,981 A | * 11/1999 | Nakashima et al. | 438/459 |
| 6,043,166 A | 3/2000 | Roitman et al. | |

FOREIGN PATENT DOCUMENTS

| | | |
|---|---|---|
| EP | 0595233 A2 | 5/1994 |
| EP | 0926725 A2 | 6/1999 |
| JP | 10079355 B1 | 3/1998 |
| WO | WO 00/13214 A1 | 3/2000 |
| WO | WO 01/84601 A2 | 11/2001 |
| WO | WO 01/45132 A2 | 6/2002 |

OTHER PUBLICATIONS

El–Ghor, M.K. et al., "Formation of Low Dislocation Density Silicon–on–insulator by a Single Implantation and Annealing," *American Institute of Physics*, vol. 57, No. 2 156–158 (1990).

Holland, O.W. et al., "Technique to Suppress Dislocation Formation During High–Dose Oxygen Implantation of Si," *American Institute of Physics*, vol. 66, No. 15 1892–1894 (1995).

Hu S.M., "Formation of Stacking Faults and Enhanced Diffusion in the Oxidation of Silicon, " *Journal of Applied Physics*, vol. 45, No. 4 1567–1572 (1974).

Margail, J. et al., "Reduced Defect Density in Silicon–on–Insulator Structures Formed by Oxygen Implantation in Two Steps," *American Institute of Physics*, vol. 54, No. 6 526–528 (1989).

Skarlatos, D. et al., "Estimation of the Number of Interstitial Atoms Injected in Silicon during Thin Oxide Formation," *Journal of the Electrochemical Society*, vol. 140, No. 6 2276–83 (1999), No date.

(List continued on next page.)

*Primary Examiner*—Alexander Ghyka
(74) *Attorney, Agent, or Firm*—Thomas J. Engellenner; Reza Mollaaghababa; Nutter McClennen & Fish LLP

(57) ABSTRACT

Methods of producing buried insulating layers in semiconductor substrates are disclosed whereby a dose of selected ions is implanted into a substrate to form a buried precursor layer below an upper layer of the substrate, followed by oxidation of the substrate in an atmosphere having a selected oxygen concentration to form an oxide surface layer. The oxidation is performed at a temperature and for a time duration such that the formation of the oxide layer causes the injection of a controlled number of atoms of the substrate from a region proximate to an interface between the newly formed oxide layer and the substrate into the upper regions of the substrate to reduce strain. A high temperature annealing step is then performed to produce the insulating layer within the precursor layer.

39 Claims, 3 Drawing Sheets

OTHER PUBLICATIONS

Venables, D. and Jones, K.S., "Low–Dislocation–Density Silicon–on–Insulator Material Produced by Sequential Oxygen Implantation and low–Temperature Annealing," *American Institute of Physics*, vol. 60, No. 25 3147–3149 (1992), No date.

Sadana, D.K. et al., "Materials Development of SIMOX with a Thin Box." Proceedings of the International SOI Conference. Palm Springs, Oct. 1993.

Liu, J. et al., "Formation of buried oxide in silicon using separation by plasma implantation of oxygen." Appl. Phys. Lett. 67 (16), Oct. 16, 1995 pp. 2361–2363.

"Low–Dose SIMOX with a Thin Buried Oxide." IBM Technical Disclosure Bulletin, IBM Corp. vol. 36, No. 11, (Nov. 1, 1993).

Jablonski, J. et al., "Effect of Oxidizing Ambient on the Generation of Microdefects in Low–Dose SIMOX Wafers." SOI Conference, New York, NY. Oct. 1996.

Maszara, W.P. et al., "Low Dose SIMOX and Impact of ITOX Process on Quality of SOI Film." SOI Conference, New York, NY. Oct. 1997.

* cited by examiner

LOW DEFECT DENSITY, THIN-LAYER, SOI SUBSTRATES

BACKGROUND OF THE INVENTION

The present invention relates generally to semiconductor processing, and more particularly, to methods for producing high quality crystalline material over a buried insulating layer in a semiconductor substrate.

A class of semiconductor structures, known as silicon-on-insulator (SOI) or semiconductor-on-insulator structures, include a thin superficial silicon layer over a buried insulating layer. SOI structures are widely utilized for construction of electronic devices. For example, such structures can be employed to produce semiconductor devices, such as VLSI devices, micro-electro-mechanical systems (MEMS), and optical devices. One method of producing an SOI structure, known by the acronym SIMOX (separation by implanted oxygen) forms a buried oxide layer (BOX) in a semiconductor substrate by implanting oxygen ions into the substrate followed by a high temperature annealing step. The insulating layer provides electrical isolation of devices that are built in the superficial silicon layer.

The implantation step of a SIMOX process typically generates defects in the upper silicon layer even when the substrate is held at an elevated temperature during the implantation step to induce dynamic annealing of damage. The doses of oxygen ions that are utilized in SIMOX processes can cause detectable strain in the upper layer lattice that can in turn generate defects, such as dislocations and/or stacking faults.

Accordingly, there exists a need for better SIMOX processing techniques to form a buried insulating layer in a substrate such that the defect density is reduced in the layer above the buried layer.

Such SOI structures having upper silicon layers with substantially fewer dislocations would address a long-felt need in the art.

SUMMARY OF THE INVENTION

Methods of producing buried insulating layers in semiconductor substrates are disclosed whereby a dose of selected ions is implanted into a substrate to form a buried precursor layer below an upper layer of the substrate, followed by a thermal treatment including oxidation of the substrate in an atmosphere having a selected oxygen partial pressure to form an oxide surface layer. The oxidation is performed at a temperature and for a time duration such that the formation of the oxide layer causes the movement of a controlled number of atoms of the substrate material from the interface of the newly formed oxide layer into the upper region of the substrate. The injection of the controlled number of atoms prior to the onset of precipitation results in reduction of strain in the lattice of the upper layer.

The oxidation temperature can be selected, for example, to be in a range of approximately 750° C. to 1150° C., and the oxidation duration can be selected to be in a range of approximately 1 to 120 minutes. The injection of a controlled number of the atoms of the substrate into the upper layer advantageously reduces strain in the upper layer. The method also includes a step of annealing the substrate to form the insulating layer within the precursor layer.

The ion implantation step of a method of the invention can be performed by utilizing a variety of different techniques. For example, a selected dose of ions can be implanted in a substrate by exposing the substrate to a beam of the ions having a selected energy. The ion energy can be, for example, in a range of about 20 keV to 450 keV. Alternatively, a plasma immersion technique can be employed for implanting a selected dose of ions in the substrate. The dose of implanted ions can be, for example, in a range of approximately $1\times10^{14}$ to $2\times10^{18}$ ions/cm$^2$.

The method of the invention can be practiced on different substrates and by employing different implanted ions. For example, the substrate can be silicon (Si), silicon carbide (SiC), or SiGe. Further, the implanted ions can be selected to be oxygen or nitrogen ions. For example, a dose of approximately $2\times10^{17}$ ions/cm$^2$ of oxygen ions at an energy of about 65 keV can be implanted in a silicon substrate. The implantation step is preferably performed while maintaining the substrate at an elevated temperature, for example, at a temperature in a range of approximately 200° C. to 700 ° C.

According to a related aspect of the invention, the method calls for performing the annealing step while maintaining the substrate temperature in a range of approximately 1300° C. to a temperature below a melting temperature of the substrate. The annealing step can be performed for a time duration of approximately a few hours. The annealing time duration can be, for example, in a range of approximately 4 hours to 30 hours. The annealing step can be performed in an inert atmosphere. For example, the annealing step can be performed in an inert atmosphere having a trace amount of oxygen (e.g., less than 1% oxygen).

In another aspect, the method of the invention calls for forming a superficial overlayer on a surface of the substrate prior to the implantation step to control a depth of ion implantation in the substrate. The superficial layer can be formed, for example, by depositing a film on the substrate. The deposited film can include, for example, SiO$_2$, amorphous silicon, or Poly-Si. The film can also include a multi-layered structure.

In a related aspect, the method of the invention can optionally remove the superficial overlayer before performing the oxidation step if oxygen atoms do not readily diffuse through the superficial overlayer to oxidize the interface of this layer and the substrate to cause injection of substrate atoms into the upper layer. For example, when a film of silicon nitride (Si$_3$N$_4$) is utilized as the superficial overlayer, the method calls for removing this film before performing the oxidation step.

Another aspect of the method of the invention ramps up the temperature of the substrate after the implantation step from ambient (e.g., 25° C.) to an intermediate value (e.g., about 600° C.) at a first selected rate (e.g., approximately 40° C./min), and further ramps up the temperature from the intermediate value to the oxidizing temperature (e.g., about 1000° C.) at a second selected rate (e.g., approximately 10° C./min).

In yet another aspect, the method of the invention calls for disposing a patterned mask on the substrate before the implantation step in order to implant ions in selective portions of the substrate, thus forming a buried insulating layer in these portions.

In another aspect, the oxidation step of the method of the invention is performed while the substrate temperature is ramped up from an initial value to a final value. The initial and final temperatures, and the ramp rate are selected such that the formation of the oxide layer causes injection of a controlled number of atoms of the substrate from a region proximate to an interface between the oxide layer and the substrate into the upper layer. The injection of the controlled number of atoms advantageously reduces strain in the upper layer.

Illustrative embodiments of the invention will be described below with reference to the following drawings.

DETAILED DESCRIPTION

The present invention describes a method for producing a buried insulating layer in a semiconductor substrate. The method includes a step of implanting a dose of selected ions into a substrate to form a buried precursor layer below an upper layer of the substrate. An ion implantation step, as used herein, refers to depositing a selected dose of ions at a particular depth of the substrate by utilizing one or more of a number of different techniques. Such techniques can include, but are not limited to, exposing the substrate to a beam of ions, plasma immersion techniques, etc.

Without any loss of generality, and for illustration purposes only, in the following exemplary embodiment, the implantation step includes exposing a substrate to a beam of ions to deposit a selected dose of the ions in the substrate. Further, although the following exemplary embodiments describe implantation of oxygen ions in a silicon substrate, other substrates and other implanted ions, such as nitrogen, can be employed in accord with the teachings of the invention to produce a buried insulating layer in a semiconductor substrate. In general, the method of the invention can be practiced on a substrate formed as a Group IV—IV, or III–V, or II–VI compound. For example, some embodiments of the invention employ SiC or SiGe substrates.

Figure 1:
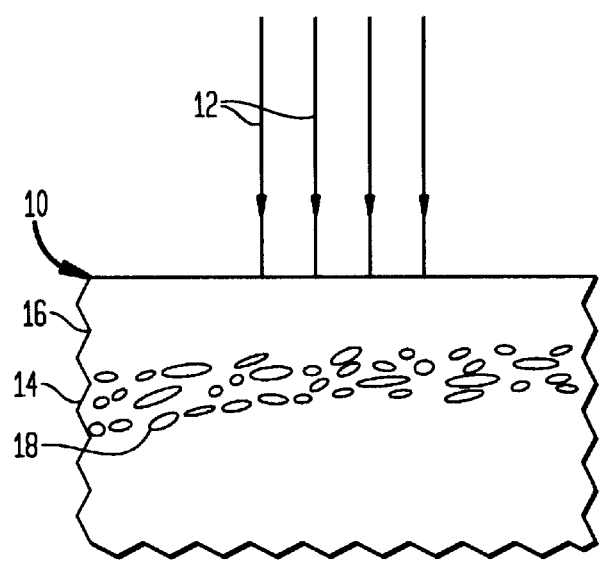
FIG. 1 illustrates schematically a semiconductor substrate exposed to beams of oxygen ions during an implantation step according to the teachings of the invention during which a precursor buried layer is formed.

FIG. 1 illustrates a semiconductor substrate 10, such as a single crystal silicon (Si) wafer, that is exposed to an oxygen ion beam or beams 12 of sufficient energy such that the ions are embedded in the wafer 10 to form a precursor layer 14 below an upper semiconductor layer 16. The precursor layer is a buried damaged layer that contains precipitates 18 of $SiO_x$. The wafer 10 is preheated to a temperature in a range of approximately 350° C. to 700° C. before the implantation step, and is maintained in this temperature range during implantation by a combination of direct heating and the heating caused by the impact of the ions with the substrate. The ion beam 12 has an energy selected to be in a range of about 20 keV to about 450 keV. Further, the dose of the oxygen ions implanted in the wafer is selected to be in a range of approximately $1 \times 10^{14}$ to $2 \times 10^{18}$ ions/cm$^2$.

Figure 2:
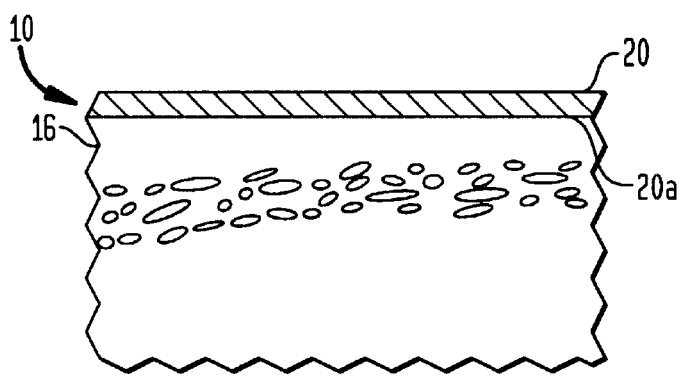
FIG. 2 illustrates schematically the substrate of FIG. 1 after an oxidation step according to the invention forms an oxide surface layer on the substrate.

With reference to FIG. 2, subsequent to the implantation step, the method of the invention calls for oxidizing the substrate 10 in an atmosphere having a selected partial pressure of oxygen to form an oxide surface layer 20. The partial pressure of oxygen is preferably selected to be equal or greater than 2%. In some instances, the oxidation step preferably is performed in an atmosphere having an oxygen concentration of between 5% and 100%. More preferably, the substrate is oxidized in a substantially pure oxygen atmosphere (100% oxygen). The oxidation temperature and the duration of the oxidation are selected such that the formation of the overlying oxide layer 20 causes the injection of a controlled number of the substrate atoms, for example silicon atoms in this exemplary embodiment, from a region proximate to an interface 20a between the oxide layer and the substrate into the upper semiconductor layer to reduce strain in the upper semiconductor layer. For example, the oxidation temperature can be selected to be in a range of approximately 750° C. to 1150° C. while the oxidation duration is within a range of approximately 1 to 120 minutes.

In this exemplary embodiment, the temperature of the substrate after the implantation step is ramped from an ambient temperature (e.g., 25° C.) to the oxidation temperature in an inert atmosphere having a trace concentration of oxygen (less than 1%). Upon reaching the oxidation temperature, the oxygen concentration is increased to cause formation of an overlying oxide layer, as described above. Alternatively, the oxygen concentration can be increased during the temperature ramp to achieve the requisite oxygen concentration and substrate temperature for oxidizing the substrate.

Figure 3:
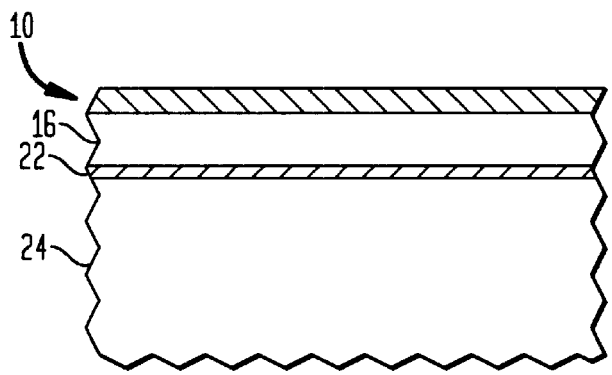
FIG. 3 illustrates schematically the substrate of FIG. 2 after a high temperature annealing step forms a buried insulating layer in the substrate, FIG. 4A provides exemplary graphs of defect density in the upper silicon layer as a function of the implanted oxygen dose for a number of SOI structures formed under different oxidation conditions in accordance with the teachings of the invention, FIG. 4B provides other exemplary graphs of defect density in the upper silicon layer as a function of the implanted oxygen dose for a number of SOI structures formed under different oxidation conditions (e.g., different temperature ramp rates and oxygen concentration) in accordance with the teachings of the invention, FIG. 5 schematically illustrates a substrate on which a superficial overlayer is formed according to one aspect of the invention before implanting a selected dose of ions therein, and FIG. 6 illustrate schematically a substrate over which a mask is formed to expose selected portions of the substrate to a beam of ions for implanting a dose of the ions in selected portions of the substrate.

Subsequent to the oxidation step, the substrate is subjected to a high temperature annealing protocol in an inert atmosphere, for example, in an atmosphere of argon or nitrogen having trace amounts of oxygen. The annealing step can be performed at a temperature in a range between approximately 1300° C. to a temperature slightly below the melting temperature of the substrate. With reference to FIG. 3, the annealing step redistributes the implanted oxygen ions and chemically bonds them to silicon to form a continuous buried layer 22 of silicon dioxide ($SiO_2$), i.e., BOX region, thereby separating an upper silicon layer 16, on the surface of which semiconductor devices are to be manufactured, from the remaining bulk silicon region 24 below. The BOX region has a thickness in a range of approximately 10 to 500 nm.

The oxidation step of the method of the invention advantageously causes migration of excess silicon atoms from a region proximate to an interface between the oxide layer and the upper layer into the upper layer, thereby relieving strain in the upper layer. In general, the implantation process, for example, bombardment of a semiconductor substrate with high energy ions induces defects and defect complexes in the lattice of the upper layer, leading to strain in the lattice. Such strain can originate, for example, from vacancy clusters formed ahead of the peak of implanted ions. Buildup of strain beyond a critical value leads to formation of extended defects, such as dislocations and/or stacking faults in the strained layer. Such dislocations can spread beyond their original boundaries during subsequent irradiation and processing steps, and create defects in the upper layer (e.g., threading dislocations and/or stacking faults) even after the completion of the annealing process.

The oxidation step of the exemplary embodiment of the invention causes supersaturation of silicon at an interface of the overlying oxide layer and the upper layer 16 of the wafer 10, thereby causing movement of silicon atoms into depth of the substrate and into vacancies in the lattice of the upper layer. In the method of the invention, the oxidation temperature and the oxidation duration are selected such that the number of atoms forced down into the lattice of the upper layer does not exceed the lattice capability to absorb them. This advantageously prevents generation of excess atoms that can cause defects in the upper layer. That is, the method of invention oxidizes the substrate after the implantation step for a time duration and at a temperature such that a controlled number of substrate atoms are injected into the upper layer so as to reduce strain in the upper layer. In general, the time duration and the temperature of oxidation can be inversely varied to generate a controlled number of interstitial atoms. For example, as a higher oxidation temperature is selected, a lower time duration is required to generate a given number of interstitial atoms.

The number of interstitial silicon atoms that can be displaced into a silicon substrate during thin oxide formation on the substrate surface is estimated to be on the order of $10^{14}$ silicon atoms/cm$^2$ at an oxidation temperature of approximately 950° C. and for an oxidation duration of approximately 30 minutes. Such a number of injected atoms is typically lower than the number of defect vacancies that are created in the upper layer by implanted doses of interest in a SIMOX process. However, the implantation process of the method of the invention is performed at an elevated temperature, thus allowing dynamic annealing of many of the defects that are created during the ion implantation step. That is, performing the implantation process at elevated temperatures results in an in-situ reduction of damage in the superficial lattice. The oxidation step of the method of the invention can further reduce the remaining defects before the annealing step forms the buried insulating layer.

Reducing the number of defects in the upper silicon layer in accord with the teachings of the invention provides a number of advantages. For example, it facilitates device production in the upper silicon layer of the SOI structure. It further allows production of devices in the upper silicon layer at a higher yield and with better quality.

Figure 4A:
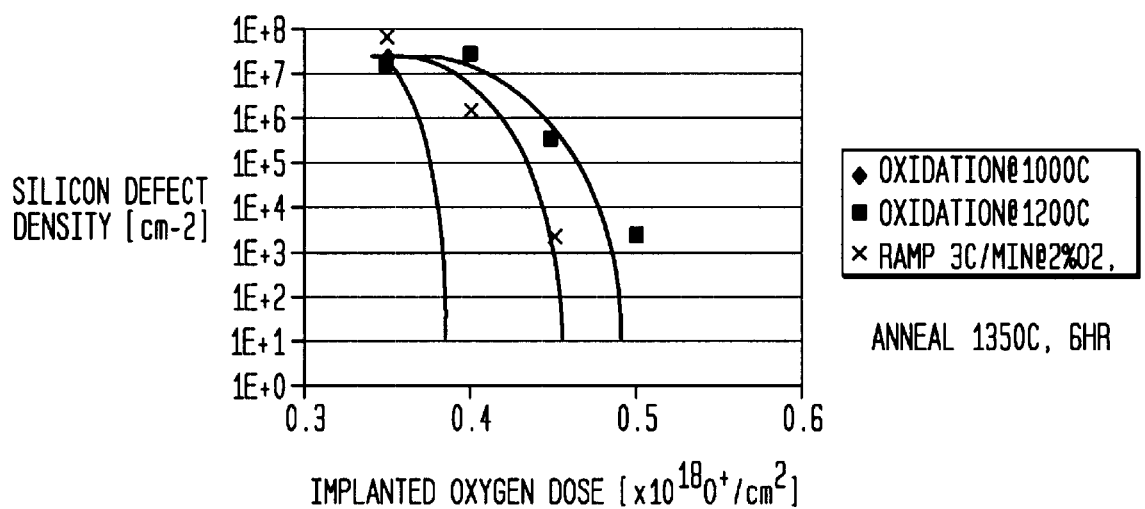
Figure 4B:
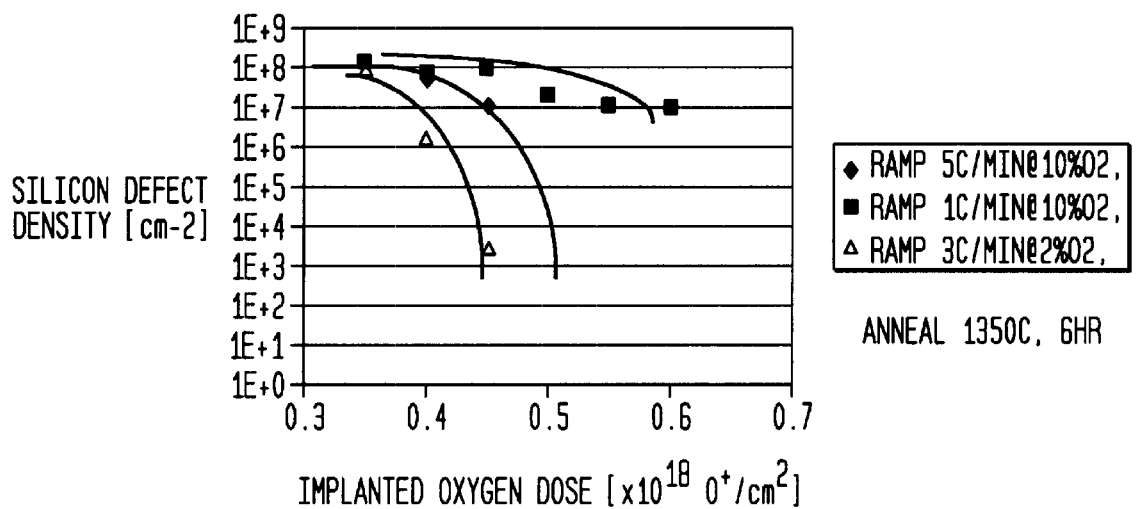

FIGS. 4A and 4B provide graphs 26 and 28 illustrating the defect densities in the upper silicon layers of exemplary SIMOX structures, produced according to the teachings of the invention and having SiO$_2$ buried insulating layers, at a given ion energy (190 keV), as a function of the implanted oxygen dose and oxidation temperature. The illustrated defect densities were measured by utilizing an enhanced Secco etch technique. FIG. 4A shows, for example, that the defect density in the upper silicon layer is below the detection level of the employed measurement technique (i.e., approximately $1.2 \times 10^3$ cm$^{-2}$) for oxygen doses in a range of approximately $0.37 \times 10^{18}$ cm$^{-2}$ to $0.6 \times 10^{18}$ cm$^{-2}$, when the oxidizing step is performed at a temperature of about 1000° C. for a duration of approximately 1 hour. The defect densities in the upper silicon layer under the other two oxidation conditions illustrated in the graph 26 are higher than the defect density when the oxidation is performed at a 1000° C. That is, in this example, selecting the oxidation temperature and the oxidation duration to be 1000° C. and 1 hour, respectively, optimizes the number of interstitial silicon atoms injected into the upper silicon layer through thermal oxidation. This in turn results in an SOI structure with an upper silicon layer having a low defect density.

In some embodiments of the invention, the oxidation step is performed as the substrate temperature is ramped from an initial value to a final value. The graph 28 of FIG. 4B illustrates measured defect densities in the upper silicon layer at three different ramp rates and two different oxygen concentrations. The lowest defect density in this example is obtained when the oxidation step is performed in an atmosphere having about 2% oxygen, and a temperature ramp rate of about 3° C./min from an initial temperature of about 800° C. to a final temperature of about 1000° C. is utilized.

Figure 5:
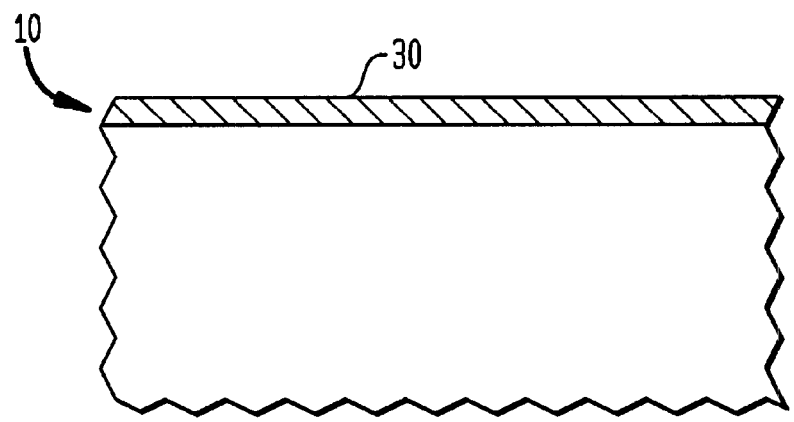

FIG. 5 shows that another embodiment of the invention forms a superficial overlayer 30 on a semiconductor substrate 10 before implanting a dose of selected ions therein. The superficial overlayer 30 allows controlling the depth of ion implantation in the substrate. The superficial layer 30 can be, for example, a film of a selected material deposited on the substrate. Such materials can include, but are not limited to, SiO$_2$, amorphous silicon, Poly-Si, and Si$_3$N$_4$. Any suitable technique for formation of the superficial overlayer 30 can be employed in the practice of the invention. Such techniques can include, but are not limited to, chemical vapor deposition (CVD), cluster deposition, thermal growth, and layer transfer techniques. For example, one embodiment of the invention employs a CVD technique for depositing the superficial layer on the substrate. An alternative embodiment grows a superficial overlayer of SiO$_2$ by thermal processes. The thickness of the superficial layer is selected by considering, for example, the desired depth of the implanted ions, the energy of the ion beam, the type of the material utilized as the superficial layer, and the rate of sputtering caused by the impact of the ions with the superficial layer.

The method of the invention calls for removing the superficial overlayer 30 before the oxidizing step if the superficial overlayer is not substantially transparent to diffusion of oxygen atoms therethrough. In such a case, the removal of the superficial layer allows the oxygen atoms to readily interact with the surface of the substrate to create an oxide overlayer, as discussed above. For example, when a film of silicon nitride is employed as a superficial layer, it is advantageous to remove it after the implantation step and before the oxidizing step because silicon nitride is substantially resistant to diffusion of oxygen atoms. Various techniques are known in the art for removing the superficial layer 30. For example, one such technique utilizes a chemical agent , such as hydrofluoric acid (HF), or an appropriate mixture of chemicals in a manner known in the art to etch the superficial film.

In contrast, the oxidizing step can proceed without removing the superficial layer if oxygen atoms can readily diffuse through the layer to reach the interface between the superficial layer and the substrate. For example, when an SiO$_2$ film is utilized as the superficial layer, the substrate can be oxidized after the implantation step without a need for removing the SiO$_2$ film.

Figure 6:
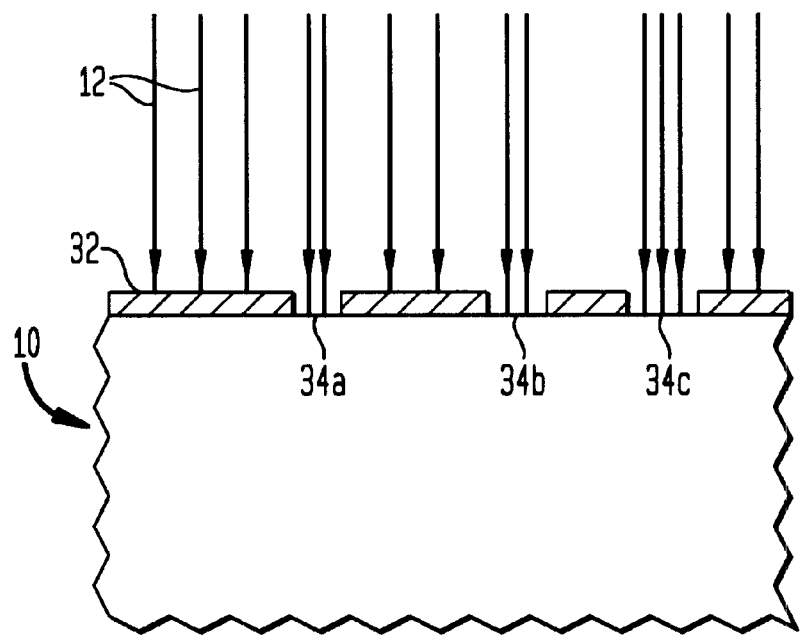

FIG. 6 depicts yet another embodiment of the invention in which a mask 32 is placed on the surface of a semiconductor 10 before an ion implantation step of a method according to the invention for producing a buried insulating layer in the substrate. The mask 32 allows exposing selective portions 34a–34c of the substrate 10 to a beam of oxygen ions 12. This allows implantation of oxygen ions, and consequently formation of a buried oxide layer in selected portions of the substrate 10. The mask 32 can be formed on the surface of the substrate by employing any known patterning method. For example, one embodiment of the invention utilizes photo-lithographic techniques to form the mask 32.

The embodiments described in the following examples provide additional illustration of the method of the invention. It should be, however, clear that various changes, additions and subtractions can be made by those skilled in the art without departing from the spirit and scope of the invention.

EXAMPLE 1

In this example, a silicon wafer is exposed to a beam of oxygen ions having an energy of 65 keV to implant a dose of $2 \times 10^{17}$ ions/cm$^2$ of oxygen ions in the wafer. The wafer is held at a temperature of approximately 500° C. during the implantation step to provide dynamic annealing of the silicon upper layer.

Subsequent to the implantation step, the wafer is cooled to ambient temperature (e.g., 25° C.). The wafer temperature is then ramped to approximately 1000° C. in an atmosphere of argon having trace amounts of oxygen (less than 2%) in two stages. In the first stage, the wafer temperature is ramped at a rate of about 40° C./min from ambient to 600° C. In the second stage, the wafer temperature is ramped from 600° C. to about 1000° C. at a rate of about 10° C./min.

The wafer is then oxidized at a temperature of approximately 1000° C. for about 20 minutes in an atmosphere having an oxygen concentration of substantially 100%. Subsequently, the wafer temperature is ramped at a rate in a range of about 0.1 to 5° C./min, in an argon atmosphere having trace amounts of oxygen (e.g., oxygen concentration of less than 2%), to a temperature of approximately 1350° C. The wafer is annealed at this temperature for about 6 hours.

The above process creates a BOX region having a thickness of approximately 560 angstrom and a superficial silicon layer having a thickness of approximately 500 angstrom. The pinhole density in the BOX region is advantageously less than about 10 cm$^{-2}$ and the dislocation density in the BOX region is less than about $10^4$ cm$^{-2}$.

EXAMPLE 2

A dose of approximately $2 \times 10^{17}$ oxygen ions is implanted in a silicon wafer by exposing the wafer to a beam of oxygen ions having an energy of about 65 keV. The wafer is held at a temperature of about 500° C. during the implantation step to provide dynamic annealing of the silicon upper layer.

Subsequent to the implantation step, the wafer is cooled to ambient temperature. The temperature is then ramped to approximately 1000° C. in an atmosphere of argon having trace amounts of oxygen (e.g., less than 2%) in two stages. In the first stage, the wafer temperature is ramped at a rate of about 40° C./min from ambient to 600° C. In the second stage, the wafer temperature is ramped from 600° C. to about 1000° C. at a rate of about 10° C./min.

The wafer is then oxidized at a temperature of approximately 1000° C. for about 20 minutes in an atmosphere having an oxygen concentration of substantially 100%. Subsequently, the wafer temperature is ramped up at a rate in a range of about 0.1 to 5° C./min, in an argon atmosphere having trace amounts of oxygen (e.g., oxygen concentration of less than 2%), to a temperature of approximately 1350° C. The wafer is annealed at this temperature for approximately 4 hours. Subsequently, the oxygen concentration is raised to about 15% while maintaining the temperature at 1350° C. The wafer is held in this condition for approximately 2 hours. The temperature is then ramped down in an inert atmosphere at a rate of 3° C./min to the ambient temperature.

Similar to the previous example, the above process results in formation of a thin layer SIMOX structure with an upper silicon layer having a thickness of about 500 angstrom, and a buried oxide (BOX) layer having a thickness of approximately 560 angstrom. The pinhole density in the BOX region is less than about 3 cm$^{-2}$, and dislocation density is less than approximately $10^4$ cm$^{-2}$.

EXAMPLE 3

A dose of approximately $0.45 \times 10^{17}$ ions/cm$^2$ of oxygen ions at an energy of about 190 keV is implanted in a silicon wafer by exposing the wafer to a beam of oxygen ions. The wafer is held at a temperature of approximately 500° C. during the implantation step to provide dynamic annealing of the silicon upper layer.

Subsequent to the implantation step, the wafer is cooled down to ambient temperature (e.g., 20° C.). The wafer is then oxidized in an atmosphere having an oxygen concentration of about 2% while the wafer temperature is ramped from an initial temperature of approximately 600° C. to a temperature of about 1300° C. at a ramp rate of approximately 3° C./min.

After the oxidation step, the wafer is annealed for approximately 6 hours at a temperature of about 1350° C. in an inert atmosphere having a trace amount of oxygen. This process results in formation of a buried SiO$_2$ layer having a thickness of about 300 nm below a silicon upper layer having a thickness of about 90 nm.

One skilled in the art will appreciate further features and advantages of the invention based on the above-described embodiments. Accordingly, the invention is not to be limited by what has particularly shown and described. All publications and references cited herein are expressly incorporated herein by reference in their entirety.

What is claimed is:

1. A method of producing a buried insulating layer in a semiconductor substrate, the method comprising the steps of:

implanting a dose of selected ions into a substrate to form a buried precursor layer below an upper layer of the substrate, oxidizing said substrate in an atmosphere having a selected oxygen partial pressure to form an oxide surface layer, said oxidizing being performed at a temperature and for a time duration such that the formation of the oxide layer causes injection of a controlled number of atoms of the substrate from a region proximate to an interface between said oxide layer and said substrate into the upper layer to reduce strain in the upper layer, and annealing said substrate, subsequent to said oxidizing step, to form said insulating layer within the precursor layer.

2. A method of producing a buried insulating layer in a semiconductor substrate, the method comprising the steps of:

implanting a dose of selected ions into a substrate to form a buried precursor layer below an upper layer of the substrate, oxidizing said substrate in an atmosphere having a selected oxygen partial pressure at an oxidizing temperature in a range of approximately 750° C. to 1150° C. and for an oxidizing duration in a range of approximately 1 to 120 minutes, and annealing said substrate to form said insulating layer within the precursor layer.

3. The method of claim 1, wherein the step of implanting comprises exposing said substrate to a beam of ions having a selected energy.

4. The method of claim 1, wherein the step of implanting comprises utilizing a plasma immersion technique.

5. The method of claim 2, wherein the step of implanting comprises selecting said ion dose to be in a range of approximately $1 \times 10^{14}$ to $2 \times 10^{18}$ ions/cm$^2$.

6. The method of claim 3, further comprising the step of selecting said beam of ions to have an energy in a range of about 20 keV to about 450 keV.

7. The method of claim 1, further comprising the step of selecting said implanted ions from the group consisting of oxygen and nitrogen.

8. The method of claim 1, wherein the step of implanting further comprises maintaining the substrate at a temperature in a range of approximately 200° C. to 700° C.

9. The method of claim 1, further comprising the step of selecting said substrate to be silicon.

10. The method of claim 1, further comprising the step of selecting said substrate to be silicon carbide.

11. The method of claim 1, further comprising the step of selecting said substrate to be SiGe.

12. The method of claim 9, wherein the step of implanting includes selecting said ions to be oxygen ions and selecting said dose to be approximately $2 \times 10^{17}$ ions/cm$^2$.

13. The method of claim 1, wherein the step of annealing further comprises maintaining said substrate at a temperature in range of approximately 1300° C. to a temperature below a melting temperature of the substrate.

14. The method of claim 13, wherein the step of annealing further comprises annealing said substrate for a time duration of approximately a few hours.

15. The method of claim 13, wherein the step of annealing further comprises annealing said substrate for a time duration in a range of approximately 4 hours to approximately 30 hours.

16. The method of claim 1, wherein the step of annealing further comprises annealing said substrate in an inert atmosphere having a trace amount of oxygen.

17. The method of claim 1, further comprising a step of forming a superficial overlayer on a surface of said substrate prior to said implantation step to control a depth of ion implantation in said substrate.

18. The method of claim 17, further comprising a step of removing said superficial overlayer before said oxidizing step.

19. The method of claim 17, wherein the step of forming a superficial overlayer comprises depositing a film on said substrate.

20. The method of claim 17, further comprising the step of selecting said film to include a multi-layered structure.

21. The method of claim 17, further comprising the step of selecting said film from the group consisting of SiO$_2$, amorphous silicon, and Poly-Si.

22. The method of claim 18, further comprising the step of selecting said film to be Si$_3$N$_4$.

23. The method of claim 7, further comprising the steps of ramping a temperature of the substrate at a first rate from an initial temperature to an intermediate value, and ramping the substrate temperature from said intermediate value to said oxidizing temperature.

24. The method of claim 23, further comprising the step of selecting said first ramp rate to be in a range of about 100° C./sec to about 40° C./sec.

25. The method of claim 23, further comprising the step of selecting said second ramp rate to be in a range of about 100° C./sec to about 40° C./sec.

26. The method of claim 24, further comprising the step of selecting said intermediate value to be 600° C. and said oxidizing temperature to be approximately 1000° C.

27. The method of claim 1, further comprising a step of disposing a patterned mask on said substrate before said implantation step so as to implant said ions in selective portions of said substrate during said implantation step.

28. A method of producing a buried SiO$_2$ layer in a silicon substrate, the method comprising the steps of:

implanting a dose of oxygen ions into the substrate by exposing said substrate to a beam of oxygen ions to form a buried precursor layer below an upper layer of the substrate, oxidizing the substrate in an atmosphere having a selected oxygen partial pressure to form an oxide surface layer, said oxidizing being performed at a temperature and for a time duration so as to cause injection of a controlled number of atoms of the substrate from a region proximate to an interface between said oxide layer and said substrate into the upper layer in order to reduce strain in the upper layer, and annealing said substrate, subsequent to said oxidizing step, to form said SiO$_2$ layer within the precursor layer.

29. A method of producing a buried insulating layer in a semiconductor substrate, the method comprising the steps of:

implanting a dose of selected ions into a substrate to form a buried precursor layer below an upper layer of the substrate, oxidizing the substrate in an atmosphere having a selected oxygen concentration while ramping a temperature of the substrate from an initial temperature to a final temperature at a selected rate to form an oxide surface layer, said initial and final temperatures and said ramp rate being selected such that the formation of the oxide layer causes injection of a controlled number of atoms of the substrate from a region proximate to an interface between said oxide layer and said substrate into the upper layer to reduce strain in the upper layer, and annealing said substrate, subsequent to said oxidizing step, to form said insulating layer within the precursor layer.

30. The method of claim 29, further comprising the step of selecting said initial temperature to be approximately 800° C. and said final temperature to be approximately 1000° C.

31. The method of claim 29, further comprising the step of selecting said initial temperature to be 600° C. and said final temperature to be approximately 1300° C.

32. The method of claim 30, further comprising the step of selecting said oxygen concentration to be 2% and said ramp rate to be 3° C./min.

33. The method of claim 31, further comprising the step of selecting said oxygen concentration to be 2% and said ramp rate to be 3° C./min.

34. The method of claim 1, further comprising performing said oxidizing step at a substrate temperature in a range of about 750° C. to about 1000° C. and for a time duration in a range of about 1 minute to about 120 minutes.

35. The method of claim 1, further comprising performing said oxidizing step at a substrate temperature in a range of about 750° C. to about 950° C. and for a time duration in a range of about 1 minute to about 120 minutes.

36. The method of claim 23, further comprising the step of selecting said first ramp rate to be approximately 40° C./min.

37. The method of claim 23, further comprising the step of selecting said second ramp rate to be approximately 10° C./min.

38. The method of claim 28, further comprising performing said oxidizing step at a substrate temperature in a range of about 750° C. to about 1000° C. and for a time duration in a range of about 1 minute to about 120 minutes.

39. The method of claim 28, further comprising performing said oxidizing step at a substrate temperature in a range of about 750° C. to about 950° C. and for a time duration in a range of about 1 minute to about 120 minutes.

* * * * *